March 22, 1960 | F. B. FIBRANZ | 2,929,926
RADIO RECEIVER WITH AUTOMATIC GAIN CONTROL OPERATING OVER WIDE RANGE
Filed April 10, 1957
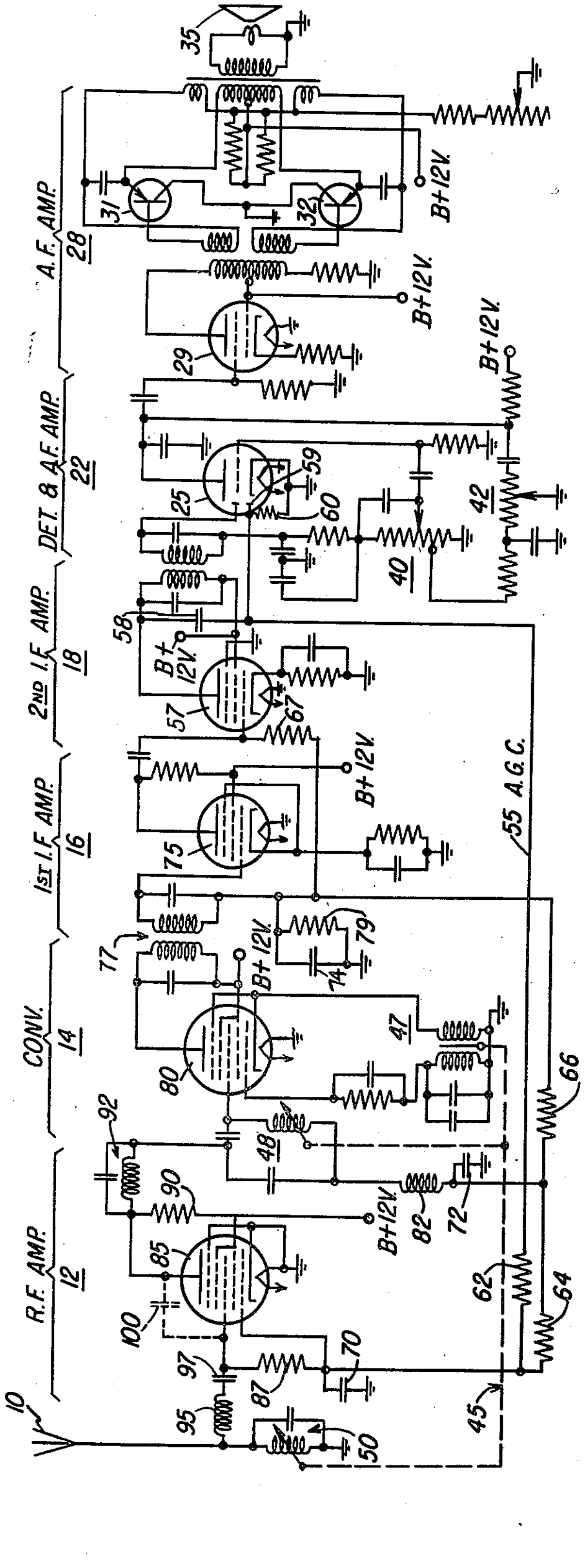
INVENTOR.
Floyd B. Fibranz
BY Mueller & Aichele
Attys.

United States Patent Office 2,929,926
Patented Mar. 22, 1960

2,929,926

RADIO RECEIVER WITH AUTOMATIC GAIN CONTROL OPERATING OVER WIDE RANGE

Floyd B. Fibranz, Elmhurst, Ill., assignor to Motorola, Inc, Chicago, Ill., a corporation of Illinois Application April 10, 1957, Serial No. 651,891

2 Claims. (Cl. 250—20)

This invention relates to radio receivers and more particularly to automatic gain control systems for the radio frequency amplifier of a receiver.

Some present day radio receivers are adapted to operate directly from a potential source of relatively low value. For example, as described in the September 1956 issue of "Radio and Television News" at page 60, an automobile radio may be operated directly from the 12-volt electrical system in an auto without the use of voltage conversion or step-up apparatus. The particular receiver referred to is of the superheterodyne type with vacuum tubes in the initial stages for amplification and frequency conversion of the signal, and with power amplification of the audio being effected by one or more transistors.

It has been found that in a receiver of this kind, overload problems can occur, in the radio frequency portions of the receiver because sufficient automatic gain control voltage is not available to properly reduce the gain of a tube operating with a low energizing potential. The first stage of the receiver, which is commonly a preselector or radio frequency amplifier stage, may present this difficulty. While such an auto receiver would at times be tuned to weak distant stations, so that amplification before frequency conversion may be necessary, it might sometimes be tuned to a strong nearby station in which case a signal of several volts may be impressed on the tube in the radio frequency amplifier stage. This could cause overloading of following stages and intermodulation problems resulting in lack of selectivity and the generation of frequency components which distort a desired signal. While an automatic gain control system may reduce the signal amplification and thus to some extent cure this fault, difficulty has been encountered in providing a sufficiently large control potential to correct this problem in a satisfactory manner when tubes are operated at 12 volts. In fact, large signals may even cause grid rectification in the first or preselector stage of the receiver which can cause distortion of the signal.

Accordingly, it is an object of the present invention to provide an improved radio receiver in which distortion at high signal levels is reduced.

Another object is to provide a radio receiver which operates directly from a low voltage source and which receiver may operate successfully in receiving a wide range of signal levels.

Another object is to provide an automatic gain control system for an automobile radio receiver which system regulates the receiver gain and particularly that of the radio frequency amplifier stage in the receiver for reducing intermodulation effects at high signal levels.

A feature of the invention is the provision of an improved preselector stage for a radio receiver including in the stage a multi-grid vacuum tube having a control grid to which is applied an automatic gain control potential and having a signal grid positioned between the anode and the control grid to which input signals are applied, whereby the gain control sensitivity of the stage is increased for a wide range of signal levels.

Another feature of the invention is the provision of a radio receiver operating directly from a voltage of the order of 12 volts and including a radio frequency amplifier utilizing a multi-grid vacuum tube and an automatic gain control system coupled to a grid of the vacuum tube which is adjacent the cathode, with signals and the automatic gain control potential also being applied to a further grid of the tube, whereby signal distortion is reduced at high signal input levels.

Further objects, features and the attending advantages of the invention will be apparent upon consideration of the following description when taken in conjunction with the accompanying drawing which is a circuit diagram of a radio receiver incorporating the invention.

In practicing the invention, there is provided a gain control system in a radio receiver subject to receive signals of widely differing strengths. The system is particularly adapted to be used with a receiver operating directly from a low energizing potential, which may be of the order of 12 volts. The first radio frequency amplifier, or preselector, comprises a multi-electrode vacuum tube which translates signals to a converter, intermediate frequency amplifier, demodulator, and audio frequency amplifier of the receiver. The receiver also includes a carrier detector to develop an automatic gain control potential which is applied to the first grid of the multi-electrode tube. Input signals are applied to a further grid of the tube which is connected to the first grid by a resistor so that the automatic gain control potential is also applied to this further grid. The tube may also include screen and suppressor grids operating in a known manner. Large signals are successfully translated by the receiver since the first stage is particularly sensitive to the automatic gain control potential and distortion of such large signals is minimized due to the effective control thus achieved.

Considering now the invention in greater detail, a description will be given of the receiver shown in the drawing. The antenna 10 is coupled to a preselector or radio frequency amplifier 12 which selects and amplifies a desired signal after which it is applied to a converter stage 14. Stage 14 includes mixer and oscillator circuitry in order to convert the signal to one of a fixed intermediate frequency. The intermediate frequency signal is then applied respectively to first and second intermediate frequency amplifiers 16 and 18 for further selection and amplification.

Demodulation of the signal is effected in the detector and first audio frequency amplifier stage 22 which incorporates a double diode-triode vacuum tube 25. The demodulated signal is amplified by the triode portion of this valve and then applied to a further audio frequency amplifier stage 28 which includes a driver tube 29 and a pair of power transistors 31, 32 which are connected in push-pull in order to provide power for driving loudspeaker 35.

It may be noted that the receiver is energized directly by a nominal potential of 12 volts which can be provided directly by the electrical system of an automobile in which the receiver may be used. Controls for the receiver include a volume control 40 which is connected into the detector portion of the receiver in a manner understood in the art. A tone control 42 is also provided and this is connected into the circuitry of stage 22.

Tuning of the receiver is effected by means of a ganged control 45 which represents mechanical coupling of the variable slugs in the inductors of a tuned circuit 47 in the local oscillator portion of stage 14, the tuned input circuit 48 for stage 14 and the tuned input circuit 50 of amplifier stage 12.

The receiver also includes means providing an automatic gain control (AGC) potential negative with respect to ground on lead 55. This is obtained by deriving a portion of the intermediate frequency signal from the anode of tube 57 in the second intermediate frequency amplifier 18 and applying it through capacitor 58 to the anode 59 of one of the diodes in tube 25. This anode is connected to the cathode through load resistor 60. Lead 55 is then connected to anode 59. The AGC potential is applied to the control grid of tube 57 through the series connection of resistors 62, 64, 66 and 67. Suitable filtering of the radio frequency and audio frequency components of the detected control signal is accomplished by means of capacitor 70, connected between the junction of resistors 62 and 64 to ground, capacitor 72, connected between the junction of resistors 64 and 66 to ground, and capacitor 74, connected from the junction of resistors 66 and 67 to ground.

The first grid of amplifier tube 75 in first intermediate frequency amplifier stage 16 is connected through the secondary winding of transformer 77 to the junction of resistors 66 and 67 so that the AGC potential is also applied to this grid. A resistor 79 is connected across capacitor 74 to provide a return for the control grids of tubes 57 and 75. The signal grid of tube 80 in the converter stage 14 is also regulated by the automatic gain control potential through the connection thereof to the junction of resistors 64 and 66 through the image trap inductor 82 and the inductor of the tuned circuit 48.

Radio frequency amplifier stage 12 includes a vacuum tube 85 which is of the heptode or pentagrid type. The gain control potential existing at the junction of resistors 62 and 64 is applied to the first or control grid of this tube. The control potential is also applied through resistor 87 to the third or signal grid of tube 85. Resistor 87 isolates the signal from the first grid which is bypassed by capacitor 70. The second and fourth grids form a screen electrode which is connected to the B-plus potential and the fifth grid, the one farthest from the cathode and nearest the anode, is a suppressor grid connected to the cathode of the tube which is grounded. The anode of tube 85 is connected to B-plus through a load resistor 90 and to the converter stage 14 through an image trap 92. The input signals for tube 85 are applied from the tuned circuit 50 through the series connection of antenna spark coil 95, and blocking capacitor 97.

It may be noted that resistors 62, 64, 66 and 79 form a voltage divider across the load resistor 60 so that different amounts of the automatic gain control potential will be applied to the stages 12, 14, 16 and 18, with stage 12 receiving the greatest portion of this control potential. By applying only the gain control potential directly to the first grid of tube 85, which preferably has a higher Gm than the third grid, it is posible to secure greatly improved gain control action since the control potential will have maximum effect on the transconductance of the tube. Gain of the stage may be greatly reduced without driving the signal grid to a point near cut off. In radio frequency amplifiers or preselectors of the prior art, high level input signals can drive the signal grid positive and cause rectification which results in distortion of the signal. In a receiver of the type being described, which operates on a low energizing potential, it may be seen that signals of one or two volts, or even more, could overdrive stages following resulting in severe distortion. However, by applying the automatic gain control potential as described, and by applying the input signal to the third grid of the tube 85, it is possible to avoid such distortion and intermodulation effects.

At very high signal input levels, sufficient gain control potential may be developed to reduce the conduction of tube 85 to the point where interelectrode capacity between the third or signal grid and the anode of the tube, together with any capacity exhibited by the socket and added to this interelectrode capacity, can provide signal coupling through the stage 12 and into the converter stage 14. The capacity which provides such coupling at very high signal levels is designated as capacitance 100.

In a constructed embodiment of the invention the following circuit constants were used:

| | | |
|---|---|---|
| Capacitor 58 | mmfd | 100 |
| Resistor 60 | meg | 8.2 |
| Resistor 62 | meg | 1.5 |
| Resistor 64 | meg | 4.7 |
| Resistor 66 | meg | 4.7 |
| Resistor 79 | meg | 1 |
| Capacitor 70 | mfd | .05 |
| Capacitor 74 | mfd | .01 |
| Tube 85 | | 12AD6 |
| Resistor 87 | meg | 10 |
| Resistor 90 | ohms | 12,000 |
| Capacitor 97 | mfd | .01 |

The invention provides therefore an automatic gain control system for a radio receiver adapted to operate directly from a low energizing potential for reception of different signals varying widely in strength. Overloading of the receiver is minimized thereby reducing distortion of the signals at high level, while at the same time maintaining sensitivity for reception of comparatively weak signals.

I claim:

1. In a superheterodyne radio receiver adapted to receive signals of widely varying strength and which includes signal converter circuit means, intermediate frequency amplifier means, detector means, audio amplifier means, and power supply means for providing a potential of the order of 12 volts for directly energizing the receiver therefrom without voltage step-up, a system for controlling input signal level to such receiver, including in combination, a preselector stage having a heptode vacuum tube therein, said vacuum tube including a cathode and an anode and first through fifth grids spaced in consecutive order between said cathode and said anode, circuit means for developing an automatic gain control potential negative with respect to a reference point and proportional to the strength of a received signal, means coupling said cathode to the reference point, means for applying the automatic gain control potential to said first grid of said vacuum tube, a bypass capacitor coupled between said first grid and the reference point for bypassing such grid at signal frequencies, a resistor connected between said first and third grids for applying the automatic gain control potential to said third grid, tuned input circuit means coupled to said third grid for coupling received signals from an antenna to said vacuum tube for translation thereby, said tuned input circuit means providing the signals of varying strength including signals exceeding one volt to said third grid, means coupling said second and fourth grids to the power supply means for energizing the same by the aforesaid potential of the order of 12 volts, means directly coupling said fifth grid to said cathode, an output load circuit coupled to said anode and to the power supply means for energizing said anode by potential no larger than the aforesaid potential of the order of 12 volts, and a circuit coupled to said output load circuit for deriving signals from said vacuum tube and applying the same to the signal converter circuit means, said vacuum tube having interelectrode capacity between said third grid and said anode so that received signals may be applied from said tuned input circuit means to said output load circuit at least partially through said interelectrode capacity upon sufficient reduction of the gain of said vacuum tube by the automatic gain control potential.

2. In a superheterodyne radio receiver adapted to receive signals of different strengths and which includes a preselector stage, a signal converter stage, intermediate frequency amplifier means, detector means, audio amplifier means, and power supply means for providing a potential of the order of 12 volts for directly energizing the receiver therefrom, the combination therewith of a heptode vacuum tube in the preselector stage, said vacuum tube including a cathode and an anode and first through fifth grids spaced in the order named between said cathode and said anode, means for developing an automatic gain control potential negative with respect to a reference point and proportional to the strength of a received signal, means for applying the automatic gain control potential to said first grid of said vacuum tube, a capacitor coupled between said first grid and the reference point for bypassing such grid at signal frequencies, a resistor interposed between said first and third grids of said vacuum tube for applying the automatic gain control potential to said third grid, input circuit means coupled to said third grid for coupling received signals to said vacuum tube for translation thereby, means coupling said second and fourth grids to the power supply means for energizing the same by the aforesaid potential, means coupling said fifth grid to the reference point, an output circuit coupled to said anode for deriving signals from said vacuum tube, means having electrical capacity connected between said input circuit means and said anode, said last named means including interelectrtode capacity between said third grid and said anode, and said first and third grids being constructed so that the effect of said first grid on the transconductance of said vacuum tube exceeds that of said third grid so that said vacuum tube can be virtually cut off by the automatic gain control potential and signals may be translated through said vacuum tube by said last named means.

References Cited in the file of this patent

UNITED STATES PATENTS

| | | |
|---|---|---|
| 2,013,297 | Black | Sept. 3, 1935 |
| 2,079,657 | Mountjoy et al. | May 11, 1937 |
| 2,531,845 | Gall | Nov. 28, 1950 |
| 2,810,071 | Race | Oct. 15, 1957 |